(12) United States Patent
Ogawa (10) Patent No.: US 10,755,796 B2
(45) Date of Patent: Aug. 25, 2020

(54) SEMICONDUCTOR DEVICE AND ELECTRONIC DEVICE

(71) Applicant: LAPIS Semiconductor Co., Ltd., Yokohama (JP)

(72) Inventor: Junya Ogawa, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 16/364,685

(22) Filed: Mar. 26, 2019

(65) Prior Publication Data

US 2019/0295682 A1    Sep. 26, 2019

(30) Foreign Application Priority Data

Mar. 26, 2018  (JP) .................................. 2018-57799

(51) Int. Cl.
*G11C 29/50* (2006.01)
*G11C 5/14* (2006.01)
*G05F 1/565* (2006.01)
*G01R 31/67* (2020.01)

(52) U.S. Cl.
CPC ........ *G11C 29/50004* (2013.01); *G01R 31/67* (2020.01); *G05F 1/565* (2013.01); *G11C 5/147* (2013.01); *G11C 29/50012* (2013.01); *G11C 2029/5004* (2013.01)

(58) Field of Classification Search
CPC ........ G11C 29/50004; G11C 29/50012; G11C 5/147; G11C 2029/5004; G11C 29/12005; G11C 29/50; G01R 31/67; G05F 1/565
See application file for complete search history.

(56) References Cited

U.S. PATENT DOCUMENTS

| 5,349,559 | A | * | 9/1994 | Park | G05F 1/465 365/201 |
| 5,712,586 | A | * | 1/1998 | Kitao | H03K 19/01758 327/333 |
| 5,831,918 | A | * | 11/1998 | Merritt | G11C 29/02 365/201 |
| 5,994,950 | A | * | 11/1999 | Ochi | G05F 1/468 327/538 |

(Continued)

FOREIGN PATENT DOCUMENTS

JP    H10-150152 A    6/1998

*Primary Examiner* — Khamdan N. Alrobaie
(74) *Attorney, Agent, or Firm* — Rabin & Berdo, P.C.

(57) ABSTRACT

Provided is a semiconductor device including a regulator that generates a first voltage and applying the first voltage to a first line; an external terminal that is connected to the first line and externally connects an external component; and a test circuit that inspects a connection state of the external component. The test circuit includes a test discharge execution unit that is configured, upon receiving a test start signal, to stop the operation of the regulator and discharge the external component by connecting the first line to a predetermined potential; and a discharge duration measurement unit that measures a time required from the reception of the test start signal to a drop of the voltage of the first line below a predetermined second voltage, as a discharge duration of the component, and generate discharge duration information about the discharge duration.

4 Claims, 5 Drawing Sheets

(56) References Cited

U.S. PATENT DOCUMENTS

| | | | | |
|---|---|---|---|---|
| 8,120,344 B2* | 2/2012 | Hoshino | ............... | G05F 1/575 |
| | | | | 307/150 |
| 2001/0002888 A1* | 6/2001 | Beigel | ............... | G11C 29/02 |
| | | | | 365/201 |
| 2015/0061631 A1* | 3/2015 | Utsuno | ............... | G05F 1/563 |
| | | | | 323/284 |

* cited by examiner

SEMICONDUCTOR DEVICE AND ELECTRONIC DEVICE

BACKGROUND OF THE INVENTION

1. Field of the Invention

The present invention relates to a semiconductor device and an electronic device including regulators.

2. Description of the Related Art

Semiconductor devices and electronic devices that incorporate regulators for generating a power supply voltage to operate internal circuits on the basis of the power supply voltage received from outside are commercially available.

As one of the semiconductor devices incorporating the regulators, a semiconductor device that is provided with an external terminal to externally connect a stabilizing capacitance, i.e., a capacitor to reduce variations in power supply voltage generated by a regulator has been known (refer to, for example, Japanese Patent Application Laid-Open No. Hei. 10-150152).

According to the semiconductor device described in Japanese Patent Application Laid-Open No. Hei. 10-150152, products are tested after manufacture prior to shipment to determine the quality of regulators themselves using external terminals. Products that have been passed the test are shipped as the semiconductor devices with capacitors connected to the external terminals thereof.

By the way, even when the capacitor is connected to the external terminal of the semiconductor device, the capacitor is sometimes disconnected from the external terminal before the shipment.

In this case, the capacitor has a poor connection to the external terminal in a state that the capacitor is present in the position of the external terminal. However, a state of the poor connection is difficult to visually identify, and this may cause problems in shipment of the products.

SUMMARY OF THE INVENTION

The present invention has an object of providing a semiconductor device including a test circuit that can inspect whether an externally connected capacitor to reduce variations in output voltage of an incorporated regulator is properly connected or not, and an electronic device.

A semiconductor device according to the present invention includes a regulator configured to generate a predetermined first voltage and apply the first voltage to a first line; an external terminal connected to the first line, the external terminal being configured to connect to an external component; and a test circuit configured to inspect a connection state of the component to the external terminal. The test circuit includes a test discharge execution unit configured, upon receiving a test start signal, to stop the operation of the regulator and discharge the external component by connecting the first line to a predetermined potential; and a discharge duration measurement unit configured to measure a time required from the reception of the test start signal to a drop of the voltage of the first line below a predetermined second voltage that is lower than the first voltage, as a discharge duration of the component, and output a test result signal including information representing the discharge duration.

An electronic device according to the present invention has a circuit board on which a memory control chip, a component connected to the memory control chip, and a memory cell array unit are mounted. The memory control chip includes a memory controller; a regulator configured to generate a predetermined first voltage and supply the first voltage to the memory controller through a first line; an external terminal connected to the first line, the external terminal externally connecting the component; a test discharge execution unit configured, upon receiving a test start signal, to stop the operation of the regulator and discharge the component by applying a predetermined potential to the first line; a discharge duration measurement unit configured to measure a time required from the reception of the test start signal to a drop of the voltage of the first line below a predetermined second voltage that is lower than the first voltage, as a discharge duration; and a second external terminal for outputting a test result signal including information representing the discharge duration measured by the discharge duration measurement unit to the outside. The component is externally connected to the external terminal of the memory control chip. The memory controller controls writing and reading of data into and from the memory cell array unit.

According to the present invention, the operation of the regulator, which generates the first voltage and applies the first voltage to the first line, is stopped in accordance with the test signal, and the first line is connected to the predetermined potential in accordance with the test signal. Therefore, the component externally connected to the external terminal connected to the first line is discharged, and the voltage of the first line is gradually reduced. The time required from the reception of the test signal to the drop of the voltage of the first line below the second voltage is measured as the discharge duration of the component, and the test result including the information representing the discharge duration is outputted. If a component having a predetermined capacitance is properly connected to the external terminal, its discharge duration is equal to or more than a predetermined reference discharge duration.

Therefore, according to the present invention, it is possible to inspect whether the capacitor having the predetermined capacitance is properly connected to the external terminal or not, on the basis of the above-mentioned result.

DETAILED DESCRIPTION OF THE INVENTION

Embodiments of the present invention will be described below in detail with reference to the drawings.

Figure 1:
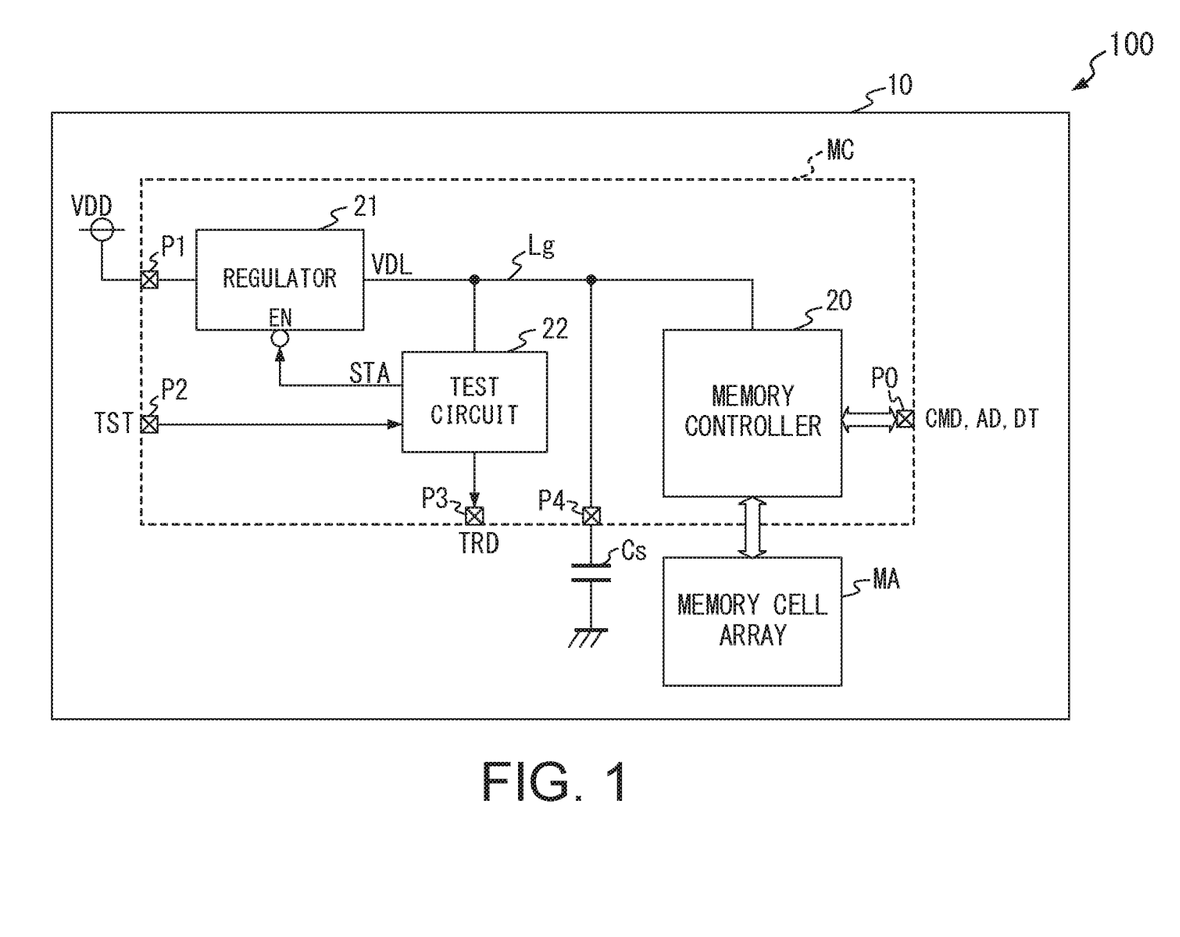
FIG. 1 is a block diagram illustrating a configuration of an electronic device 100 having a circuit board 10 on which a memory control chip MC as a semiconductor device according to the present invention, a memory cell array unit MA, and a capacitor Cs are mounted.

FIG. 1 is a block diagram illustrating a configuration of an electronic device 100 having a circuit board 10 on which a memory control chip MC as a semiconductor device according to the present invention, a memory cell array unit MA, and a capacitor Cs are mounted.

In the memory cell array unit MA, a plurality of memory cells each of which stores binary or multilevel data are arranged. In the memory cell array unit MA, data is written into a plurality of memory cells belonging to a specified address in accordance with write access from the memory control chip MC. The memory cell array unit MA outputs the data written in the memory cells belonging to the specified address in accordance with read access from the memory control chip MC, and the output data is supplied to the memory control chip MC. [0017]

The memory control chip MC is a semiconductor IC chip and includes a memory controller 20, a regulator 21, and a test circuit 22.

The memory controller 20 operates with an internal power supply voltage VDL generated by the regulator 21. The memory controller 20 receives various command signals CMD (an enable signal, a write signal, a read signal, and the like), an address AD or write data DT from the outside of the semiconductor IC chip through an external terminal group P0. The memory controller 20 makes the above-described write access to the memory cell array unit MA in accordance with the command signal CMD, the address AD, and the write data DT. The memory controller 20 also makes the above-described read access to the memory cell array unit MA in accordance with the command signal CMD and the address AD. The memory controller 20 outputs data read from the memory cell array unit MA as read data DT through the external terminal group P0.

The regulator 21 receives an external power supply voltage VDD through an external terminal P1 of the semiconductor IC chip, and generates a voltage of a predetermined voltage level on the basis of the external power supply voltage VDD. The regulator 21 supplies the generated voltage as an internal power supply voltage VDL to the memory controller 20 and the test circuit 22 through a power line Lg.

The regulator 21 receives a test execution signal STA transmitted from the test circuit 22 at an enable terminal EN of itself. Only when the test execution signal STA is in a state of a logic level 0, which represents non-execution of a test, the regulator 21 generates the above-described internal power supply voltage VDL.

When the test execution signal STA is in a state of a logic level 1, which promotes execution of the test, the regulator 21 stops generating the internal power supply voltage VDL, and sets an output terminal of itself in a high impedance state.

Upon receiving a test start signal TST, which promotes a start of the test, through an external terminal P2 of the semiconductor IC chip, the test circuit 22 first supplies, for example, the test execution signal STA of the logic level 1, which promotes the execution of the test, to the enable terminal EN of the regulator 21. The test circuit 22 thereby stops the operation of the regulator 21. Then, the test circuit 22 makes a test to inspect whether the capacitor Cs, which is an external capacitive component having a predetermined capacitance, is properly connected to an external terminal P4 or not on the basis of the voltage of the power line Lg. Note that, the capacitor Cs is a stabilizing capacitance to reduce variations in the internal power supply voltage VDL generated by the regulator 21. One end of the capacitor Cs is externally connected to the external terminal P4 of the semiconductor IC chip, and the other end thereof is applied with a ground potential.

The test circuit 22 outputs a test result signal TRD, which indicates a test result, through an external terminal P3 of the semiconductor IC chip.

Figure 2:
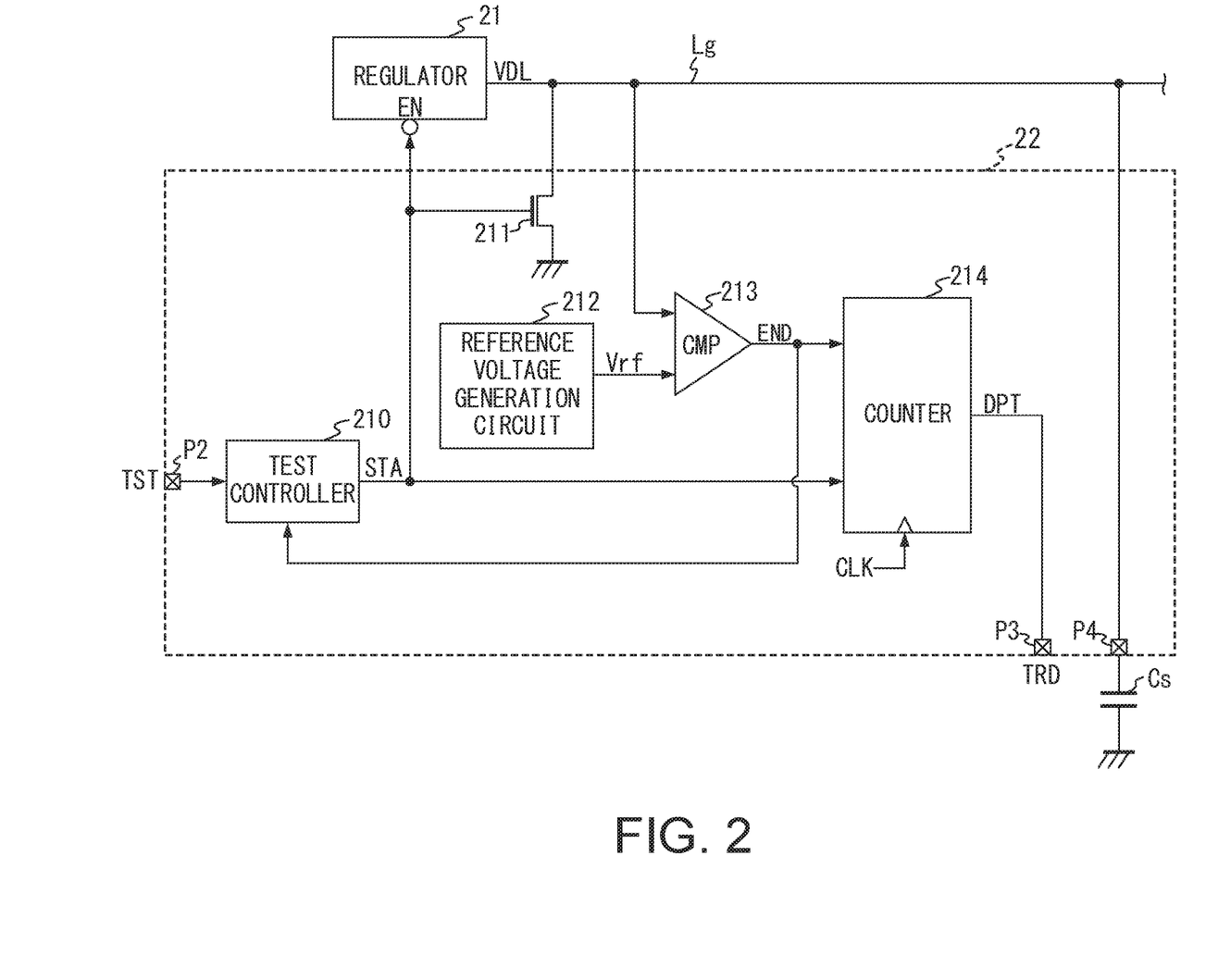
FIG. 2 is a block diagram illustrating an example of an internal configuration of a test circuit 22.

FIG. 2 is a block diagram illustrating an example of the internal configuration of the test circuit 22. As illustrated in FIG. 2, the test circuit 22 includes a test controller 210, an n-channel MOS (metal oxide semiconductor) transistor 211, a reference voltage generation circuit 212, a comparator 213, and a counter 214.

Upon receiving the test start signal TST of the logic level 1, which promotes the start of the test, through the external terminal P2, the test controller 210 supplies, for example, the test execution signal STA of the logic level 1 to the regulator 21, a gate of the transistor 211, and the counter 214. When, for example, a test end signal END of a logic level 1, which promotes an end of the test, is supplied from the comparator 213, the test controller 210 shifts the state of the test execution signal STA from the logic level 1 to the logic level 0.

A drain of the transistor 211 is connected to the power line Lg, and a source of the transistor 211 is applied with a ground potential. While the test execution signal STA is in the state of the logic level 1, the transistor 211 is turned on and applies the ground potential to the power line Lg. While the test execution signal STA is in the state of the logic level 0, the transistor 211 is turned off and stops applying the ground potential to the power line Lg.

The reference voltage generation circuit 212 generates a reference voltage Vrf having a predetermined voltage level, and supplies the reference voltage Vrf to the comparator 213. The reference voltage Vrf has a voltage level in which, for example, a predetermined margin voltage is added to a voltage generated in the power line Lg after the regulator 21 has been shifted from an operation state to a stop state, in a state that the capacitor Cs is disconnected from the external terminal P4.

The comparator 213 compares between the voltage of the power line Lg and the reference voltage Vrf. When the voltage of the power line Lg is equal to or more than the reference voltage Vrf, the comparator 213 generates the test end signal END of a logic level 0. On the other hand, when the voltage of the power line Lg is less than the reference voltage Vrf, the comparator 213 generates the test end signal END of the logic level 1, which promotes the end of the test.

The comparator 213 supplies the generated test end signal END to the above-described test controller 210 and counter 214.

While the test execution signal STA of the logic level 1 is being received, the counter 214 counts the number of pulses of a clock signal CLK to obtain a count value. Upon receiving the test end signal END of the logic level 1, the counter 214 stops the counting operation, and specifies the count value at the time of stopping as a discharge duration of the capacitor Cs, and supplies discharge duration information DPT representing the discharge duration to the external terminal P3.

In the embodiment of FIG. 2, the test circuit 22 outputs the test result signal TRD, which indicates the discharge duration information DPT as a test result, through the external terminal P3.

The test to be made before shipment of a product of the circuit board 10 illustrated in FIG. 1 will be described below.

Figure 3:
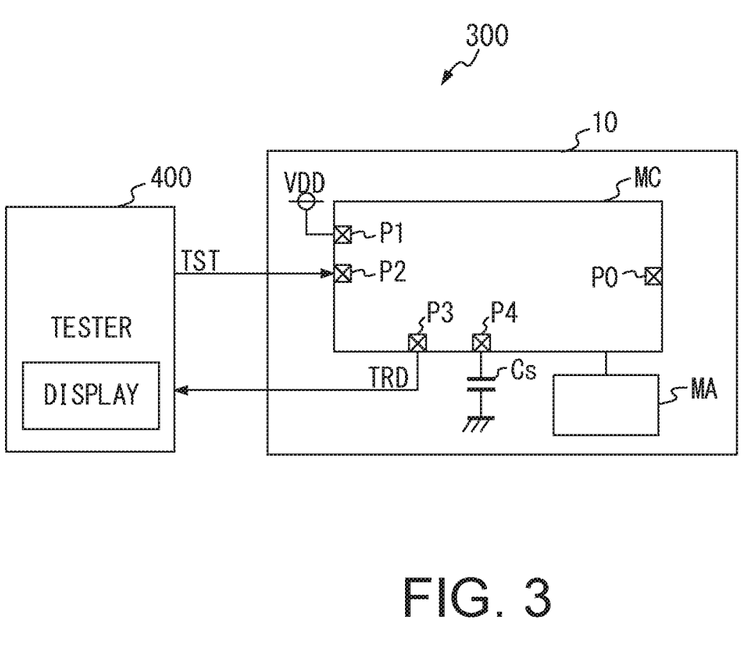
FIG. 3 is a block diagram illustrating a configuration of a test system 300 for performing a test before shipment of a product.
Figure 4:
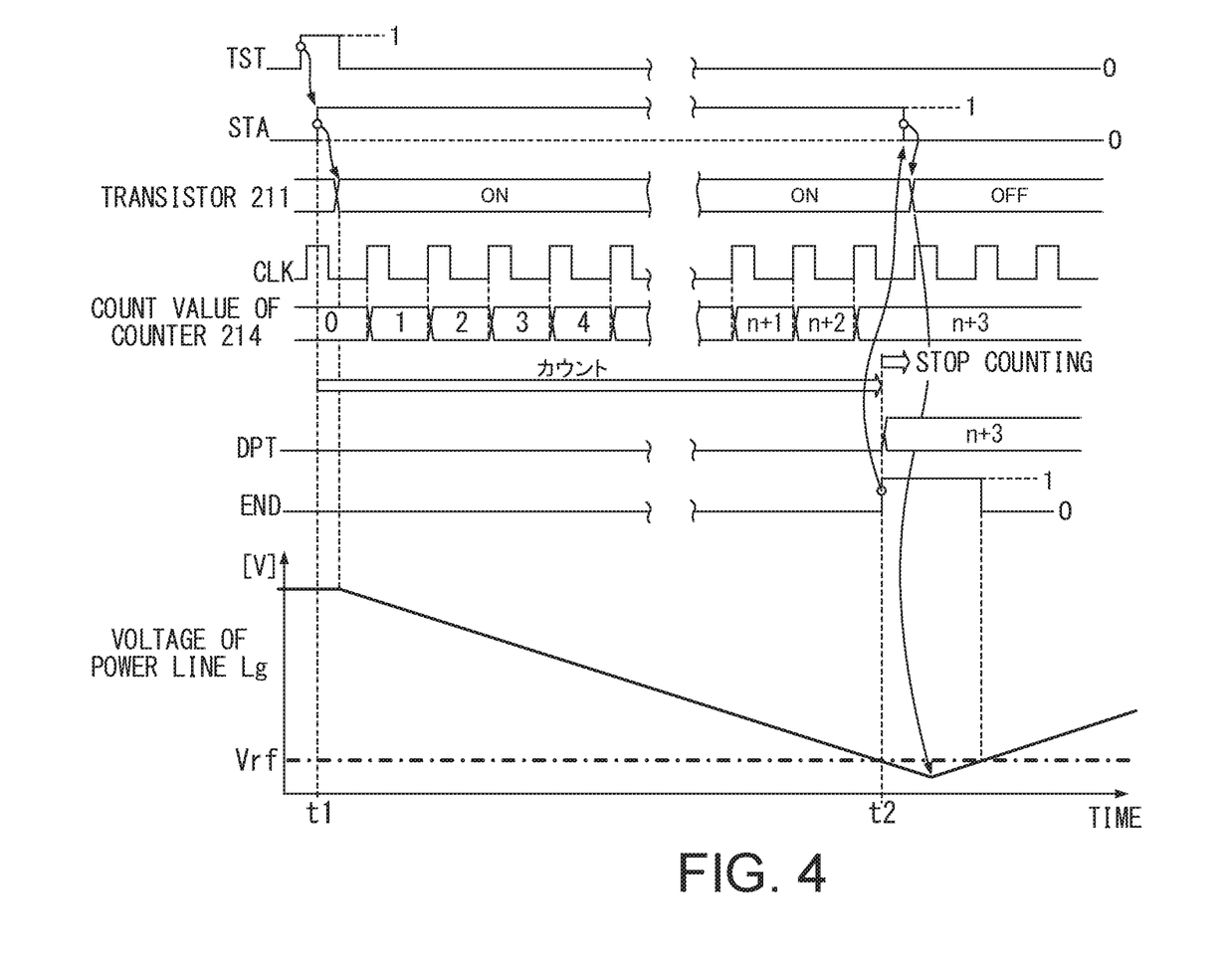
FIG. 4 is a timing chart showing a test sequence.

FIG. 3 is a block diagram illustrating a configuration of a test system 300 to make the test before shipment of a product, and FIG. 4 is a timing chart showing a test sequence.

In the test system 300 illustrated in FIG. 3, a tester 400 is connected to the external terminals P2 and P3 of the memory control chip MC mounted on the circuit board 10.

First, an external power supply voltage VDD is applied to the circuit board 10 to actuate the regulator 21. The regulator 21 thereby generates an internal power supply voltage VDL and applies the internal power supply voltage VDL to the power line Lg. At this time, if the capacitor Cs is properly connected to the external terminal P4 of the memory control chip MC, the capacitor Cs is charged and electric charge is accumulated in the capacitor Cs.

After that, as illustrated in FIG. 4, the tester 400 supplies a test start signal TST of a logic level 1, which promotes a start of a test, to the external terminal P2 of the memory control chip MC.

As illustrated in FIG. 4, in response to the test start signal TST of the logic level 1, the test controller 210 of the memory control chip MC shifts from a logic level 0 to a logic level 1, and generates a test execution signal STA to maintain the state of the logic level 1.

In response to the test execution signal STA of the logic level 1, the regulator 21 stops the operation of generating the internal power supply voltage VDL, and sets the output terminal of itself into a high-impedance state.

As illustrated in FIG. 4, in response to the test execution signal STA of the logic level 1, the transistor 211 is turned on, and a ground potential is applied to the power line Lg.

The electric charge accumulated in the capacitor Cs is thereby discharged, and therefore the voltage of the power line Lg is gradually reduced as illustrated in FIG. 4.

As illustrated in FIG. 4, the counter 214 starts counting the number of pulses of a clock signal CLK from a time t1 at which the test execution signal STA shifts from the logic level 0 to the logic level 1. The counter 214 continues counting operation while the test execution signal STA is kept in the state of the logic level 1, as illustrated in FIG. 4.

When the voltage of the power line Lg is gradually reduced and falls below a reference voltage Vrf at a time t2 of FIG. 4, the comparator 213 supplies a test end signal END of a logic level 1 to the counter 214 and the test controller 210, as illustrated in FIG. 4.

The counter 214 stops the counting operation in response to the test end signal END of the logic level 1, and outputs the count value at the time of stopping as discharge duration information DPT, which represents a discharge duration of the electric charge accumulated in the capacitor Cs. For example, in the example of FIG. 4, the counter 214 outputs a count value (n+3) (n is a positive integer) as the discharge duration information DPT representing the discharge duration.

In other words, as illustrated in FIG. 4, the counter 214 measures a time period between the time t1 and the time when the gradually reduced voltage of the power line Lg reaches the reference voltage Vrf, as the discharge duration required to discharge the electric charge accumulated in the capacitor Cs. The counter 214 supplies a test result signal TRD that includes the discharge duration information DPT representing the measured discharge duration to the tester 400 through the external terminal P3.

In response to the test end signal END of the logic level 1, as illustrated in FIG. 4, the test controller 210 shifts the test execution signal STA from the state of the logic level 1, which promotes the execution of the test, to the state of a logic level 0, which represents non-execution of the test. Furthermore, as illustrated in FIG. 4, in response to the test execution signal STA of the logic level 0, the transistor 211 shifts from an on state to an off state, and the regulator 21 starts generating an internal power supply voltage and applies the generated voltage to the power line Lg. Therefore, as illustrated in FIG. 4, the voltage of the power line Lg is gradually increased. After that, when the voltage of the power line Lg reaches the reference voltage Vrf or more, as illustrated in FIG. 4, the comparator 213 shifts the test end signal END from the state of the logic level 1 to the state of a logic level 0.

Therefore, after the time t2 illustrated in FIG. 4, at the time when the regulator 21 starts operation and the transistor 211 shifts from the on state to the off state, the test operation by the test circuit 22 is ended.

The tester 400 determines whether or not the discharge duration represented by the discharge duration information DPT included in the test result signal TRD is less than a predetermined reference discharge duration. The reference discharge duration represents, for example, a minimum time period within a conceivable range of a discharge duration that is required to discharge electric charge accumulated in the capacitor Cs, when the capacitor Cs having a predetermined capacitance is properly connected to the external terminal P4.

Accordingly, if the capacitor Cs having the predetermined capacitance is properly connected to the external terminal P4, the discharge duration represented by the discharge duration information DPT is equal to or more than the reference discharge duration. On the other hand, when the capacitance of the capacitor Cs is less than the predetermined capacitance, or when the capacitor Cs is not properly connected to the external terminal P4, the discharge duration represented by the discharge duration information DPT is less than the reference discharge duration.

When the discharge duration represented by the discharge duration information DPT captured at the time t2, illustrated in FIG. 4, or later is determined to be less than the reference discharge duration, an image representing that the capacitor Cs is not properly connected in, e.g., text form or the like is displayed on a display unit. On the other hand, when the discharge duration represented by the discharge duration information DPT is determined to be equal to or more than the reference discharge duration, the tester 400 displays an image representing the capacitor Cs is properly connected to the external terminal P4 is displayed on the display unit.

By the way, the discharge duration represented by the discharge duration information DPT depends on the capacitance of the capacitor Cs connected to the external terminal P4. Accordingly, a map representing the correspondence relationship between the discharge duration and the capacitance may be generated in advance. The tester 400 may retrieve a capacitance corresponding to the discharge duration represented by the discharge duration information DPT in the map, and display an image representing the capacitance on the display unit.

As described above, the test circuit 22 illustrated in FIG. 2 can inspect, in the test before shipment of the product, whether the capacitor Cs that is externally connected to reduce variations in the internal power supply voltage generated by the regulator 21 is properly connected or not.

In the test circuit 22 illustrated in FIG. 2, the test result signal TRD including the discharge duration information DPT measured by the counter 214 is outputted as a signal indicating a test result through the external terminal P3, but the contents of the test result signal are not limited to the discharge duration information DPT.

Figure 5:
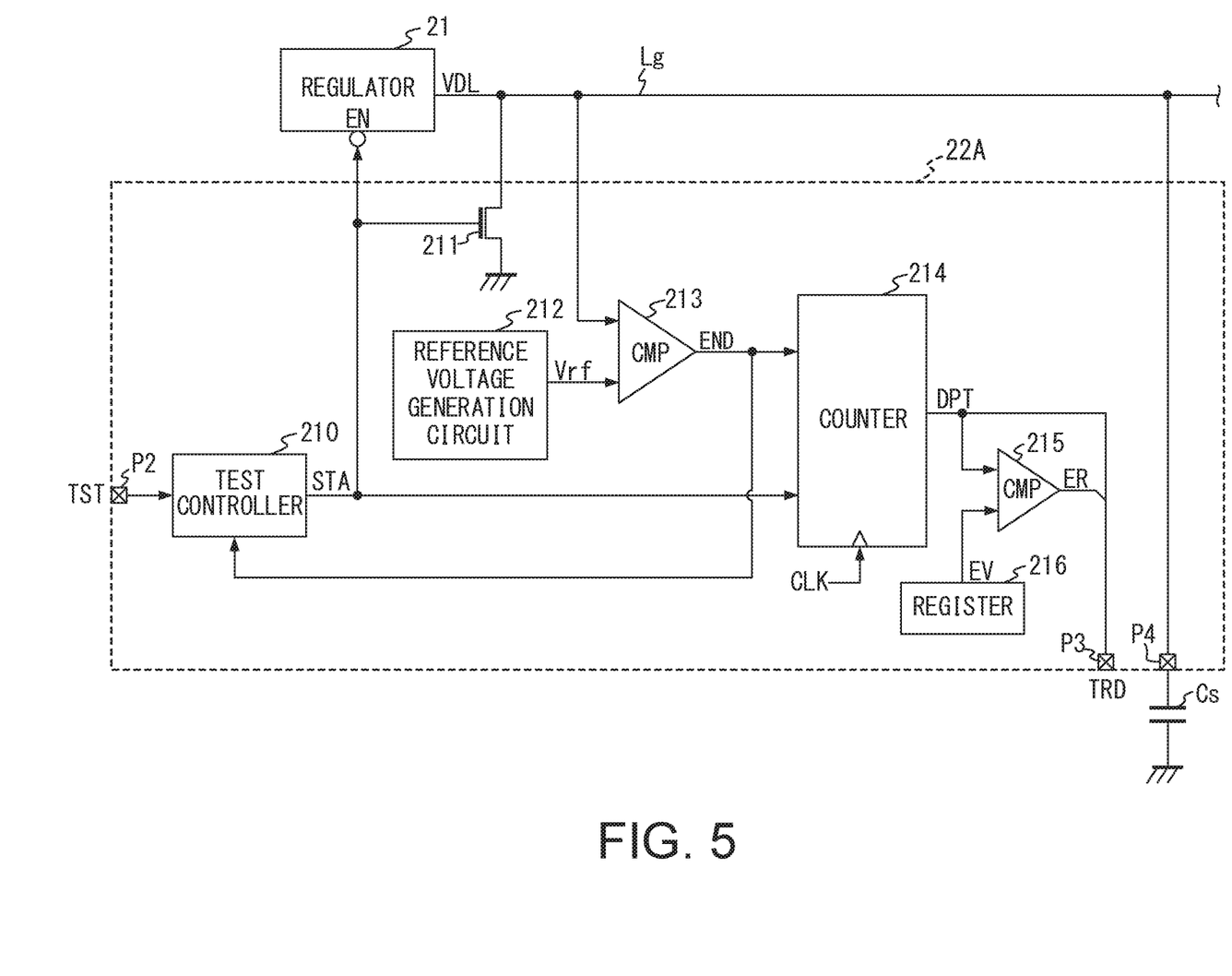
FIG. 5 is a block diagram illustrating an internal configuration of a test circuit 22A as a modified example of the test circuit 22.

In consideration of the above-described matters, FIG. 5 is a block diagram of an internal configuration of a test circuit 22A, as a modified example of the test circuit 22 illustrated in FIG. 2.

The configuration and operation of FIG. 5 are the same as those of FIG. 2, except that a comparator 215 and a register 216 are newly added. The operation of a test circuit 22A will be described below with respect to the comparator 215 and the register 216.

In the configuration of FIG. 5, the counter 214 supplies measured discharge duration information DPT to the external terminal P3 and the comparator 215.

The register 216 stores information representing a reference discharge duration used in the tester 400. The register 216 supplies reference discharge duration information EV representing the reference discharge duration stored in itself to the comparator 215.

The comparator 215 compares between the discharge duration represented by the above-described discharge duration information DPT and the reference discharge duration represented by the reference discharge duration information EV. In other words, the comparator 215 determines whether the discharge duration represented by the discharge duration information DPT is less than the reference discharge duration represented by the reference discharge duration information EV or not.

When the discharge duration represented by the discharge duration information DPT is determined to be less than the reference discharge duration represented by the reference discharge duration information EV, the comparator 215 generates connection state information ER of a logic level 1, which represents that the capacitor Cs is not properly connected to the external terminal P4.

On the other hand, when the discharge duration represented by the discharge duration information DPT is determined to be equal to or more than the reference discharge duration represented by the reference discharge duration information EV, the comparator 215 generates connection state information ER of a logic level 0, which represents that the capacitor Cs having the predetermined capacitance is properly connected to the external terminal P4.

The comparator 215 supplies the generated connection state information ER to the external terminal P3. The test circuit 22A supplies a test result signal TRD including the connection state information ER and the discharge duration information DPT as a test result to the tester 400 through the external terminal P3.

The tester 400 displays an image that represents the contents of the connection state information ER included in the test result signal TRD, in other words, an image representing whether the capacitor Cs having the predetermined capacitance is properly connected or not, on the display unit. The tester 400 retrieves the capacitance of the capacitor Cs in the above-described method on the basis of the discharge duration information DPT, and displays an image representing the capacitance on the display unit.

In the configuration of FIG. 5, the test result signal TRD including the discharge duration information DPT and the connection state information ER is outputted to the outside through the external terminal P3, but a test result signal TRD including only the connection state information ER may be outputted to the outside.

In the embodiments of FIGS. 2 and 5, the test controller 210 and the transistor 211 are adopted as a test discharge execution unit to discharge electric charge accumulated in the capacitor Cs in response to the test start signal TST, but the present invention is not limited to this configuration.

In the embodiments of FIGS. 2 and 5, the reference voltage generation circuit 212, the comparator 213, and the counter 214 are adopted as a discharge duration measurement unit to measure the discharge duration required to discharge electric charge accumulated in the capacitor Cs, but the present invention is not limited to this configuration.

In short, a memory control chip MC as a semiconductor device may be any device as long as the device includes a regulator (21) that generates a predetermined first voltage (VDL) and applies the first voltage to a first line (Lg), an output terminal (P4) that is connected to the first line and externally connects a component (Cs), and a test circuit (22) having the following configuration.

The test circuit (22) includes a test discharge execution unit and a discharge duration measurement unit.

Upon receiving a test start signal (TST), the test discharge execution unit (210, 211) stops the operation of the regulator (21), and connects the first line (Lg) to a predetermined potential (for example, a ground potential) to discharge the component (Cs) connected to the external terminal. The discharge duration measurement unit (212, 213 and 214) measures a time required from the reception of the test start signal (TST) to a drop of the voltage of the first line (Lg) below a predetermined second voltage (Vrf) lower than the first voltage (VDL), as a discharge duration of the component (Cs), and outputs a test result signal (TRD) including information (DPT) representing the discharge duration.

It is understood that the foregoing description and accompanying drawings set forth the preferred embodiments of the present invention at the present time. Various modifications, additions and alternative designs will, of course, become apparent to those skilled in the art in light of the foregoing teachings without departing from the spirit and scope of the disclosed invention. Thus, it should be appreciated that the present invention is not limited to the disclosed Examples but may be practiced within the full scope of the appended claims. This application is based upon and claims the benefit of priority from the prior Japanese Patent Application No. 2018-57799 filed on Mar. 26, 2018, the entire contents of which are incorporated herein by reference.

What is claimed is:

1. A semiconductor device comprising:
    a regulator configured to generate a first voltage and apply the first voltage to a first line;
    an external terminal connected to said first line, said external terminal being configured to connect to an external component; and
    a test circuit configured to inspect a connection state of said external component to said external terminal, wherein
    said test circuit includes:
        a test discharge execution unit configured, upon receiving a test start signal, to stop an operation of said regulator and discharge said external component by connecting said first line to a predetermined potential; and
        a discharge duration measurement unit configured to measure a time required from the reception of said test start signal to a drop of the voltage of said first line below a predetermined second voltage that is lower than said first voltage, as a discharge duration of said component, and generate discharge duration information representing said discharge duration, and wherein
    said test circuit is configured to output a test result signal including the discharge duration information.

2. The semiconductor device according to claim 1, wherein
said test discharge execution unit includes:
a test controller configured to generate a test execution signal in a state of a first level in accordance with said test start signal, and upon receiving a test end signal, shift said test execution signal from a state of said first level to a state of a second level; and
a switching element that is turned off when said test execution signal is in the state of said second level, and is turned on to apply a ground potential to said first line as said predetermined potential when said test execution signal is in the state of said first level, and
the discharge duration measurement unit includes:
a first comparator configured to make a comparison between the voltage of said first line and said second voltage, and when the voltage of said first line is lower than said second voltage, generate a signal to promote an end of a test as said test end signal; and
a counter configured to receive a clock signal,
count the number of pulses of said clock signal, while said test execution signal is in the state of the first level, to obtain a count value, and in accordance with the test end signal, stop counting operation and output said count value as information representing said discharge duration.

3. The semiconductor device according to claim 1 further comprising:
a register configured to store information representing a predetermined reference discharge duration; and
a second comparator configured to make a comparison between said reference discharge duration stored in said register and said discharge duration, and generate, when said discharge duration is equal to or more than said reference discharge duration, connection state information representing that said external component is properly connected to said external terminal, and generate, when said discharge duration is less than said reference discharge duration, connection state information representing that said external component is not properly connected to said external terminal, wherein
said test circuit is configured to output the test result signal including the discharge duration information and the generated connection state information.

4. An electronic device comprising a circuit board on which a memory control chip, a component connected to said memory control chip, and a memory cell array unit are mounted, wherein
the memory control chip includes:
a memory controller;
a regulator configured to generate a first voltage and supply said first voltage to said memory controller through a first line;
an external terminal connected to said first line, the external terminal externally connecting said component;
a test discharge execution unit configured, upon receiving a test start signal, to stop an operation of said regulator and discharge said component by applying a predetermined potential to said first line;
a discharge duration measurement unit configured to measure a time required from the reception of said test start signal to a drop of the voltage of said first line below a second voltage that is lower than said first voltage, as a discharge duration; and
a second external terminal for outputting a test result signal including information representing said discharge duration measured by said discharge duration measurement unit to the outside,
said component is externally connected to said external terminal of said memory control chip, and
said memory controller controls writing and reading of data into and from said memory cell array unit.

* * * * *